United States Patent [19]

Slemmer

[11] Patent Number: 5,469,116

[45] Date of Patent: Nov. 21, 1995

[54] CLOCK GENERATOR CIRCUIT WITH LOW CURRENT FREQUENCY DIVIDER

[75] Inventor: William C. Slemmer, Dallas, Tex.

[73] Assignee: SGS-Thomson Microelectronics, Inc., Carrollton, Tex.

[21] Appl. No.: 188,153

[22] Filed: Jan. 27, 1994

[51] Int. Cl.⁶ .................. H03B 5/30; H03B 5/36
[52] U.S. Cl. .............. 331/74; 331/116 FE; 331/158; 326/93; 326/96; 327/544; 327/291; 327/115; 327/1176; 377/126
[58] Field of Search ............. 331/74, 116 FE, 331/158; 307/111, 114, 47, 48, 49, 271; 326/93, 96; 327/544, 113, 114, 115, 117, 118, 291, 294–296; 377/124, 122, 126

[56] References Cited

U.S. PATENT DOCUMENTS

| | | | |
|---|---|---|---|
| 3,956,880 | 5/1976 | O'Connor | 331/116 FE X |
| 3,999,368 | 12/1976 | Yoshida | 331/158 X |
| 4,094,137 | 6/1978 | Morokawa | 331/116 FE |
| 4,389,728 | 6/1983 | Tsuyuki | 377/114 |
| 4,591,808 | 5/1986 | Lucas et al. | 331/116 FE |
| 4,656,649 | 4/1987 | Takahashi | 377/48 |
| 5,065,415 | 11/1991 | Yamashita | 377/52 |
| 5,172,400 | 12/1992 | Maemura | 377/116 |

FOREIGN PATENT DOCUMENTS

| | | | |
|---|---|---|---|
| 0112008 | 8/1980 | Japan | 331/158 |
| 0125701 | 9/1980 | Japan | 331/116 FE |
| 0092144 | 6/1983 | Japan | 377/48 |
| 04142116 | 5/1992 | Japan | 377/49 |
| 05347554 | 12/1993 | Japan | 377/49 |

*Primary Examiner*—Benny Lee
*Assistant Examiner*—Arnold Kinkead
*Attorney, Agent, or Firm*—Rodney M. Anderson; Lisa K. Jorgenson; Richard K. Robinson

[57] ABSTRACT

A clock generator circuit for producing a clock signal while drawing reduced current drain is disclosed. The clock generator circuit includes a crystal oscillator which produces a periodic signal having a relatively small voltage swing, controlled by one or more reference voltages; the reference voltages are preferably produced by a sub-threshold biased voltage reference circuit. The small signal output of the crystal oscillator is applied to the first of a series of frequency divider stages, prior to amplification by a level shift circuit. Each divider stage includes a current switch which switches the current drawn through current divider legs to produce output signals to latches in the divider stage. Each divider stage also includes one or more current source switched latches, each controlled by current sources that are switched by the current switch. As a result, each divider stage divides the frequency of the oscillator output signal without requiring amplification of the signal, thus reducing the active current. The output of the last divider stage is applied to a level shift circuit to provide the large voltage swing clock signal.

17 Claims, 5 Drawing Sheets

CLOCK GENERATOR CIRCUIT WITH LOW CURRENT FREQUENCY DIVIDER

This invention is in the field of integrated circuits, and is more specifically directed to clock generator circuits for the same.

BACKGROUND OF THE INVENTION

Due to recent advances in the field, modern semiconductor integrated circuits have the capability of providing a high degree of functionality and performance with low active power dissipation. In particular, complementary metal-oxide-semiconductor (CMOS) technology provides circuits that can have quite fast switching times with extremely low levels of DC power dissipation. These advances have enabled complex electronic systems to now use batteries and other alternative power sources as primary or backup power. Examples of such systems include portable personal computers of the "notebook" or "laptop" class, personal digital assistants (PDAs), and cellular telephones and facsimile machines.

While many digital circuit functions are readily implemented in CMOS in such a manner that the steady-state power dissipation is extremely low (e.g., CMOS inverters and other logic gates), certain necessary circuit functions are not so easily implemented in that manner. An example of such a circuit function is a clock generator circuit, such as those based on a crystal oscillator. Clock generator circuits are inherently in a constant switching mode, and seldom in a DC state, and thus cannot readily take advantage of the extremely low steady-state power dissipation provided by CMOS technology.

Referring now to FIG. 1, clock generator circuit 10 according to the prior art will now be described in detail. Clock generator circuit 10 utilizes crystal oscillator 14 to generate a periodic signal that is amplified by level shift circuit 16. The amplified periodic signal is then presented to frequency divider 18 to produce an output clock signal of the desired frequency at terminal CLK. According to this conventional approach, reference voltages $V_{pref}$ and $V_{nref}$ are generated by low-current reference circuit 12 and applied to crystal oscillator 14 to control the voltage swing of the output clock signal. Reference circuit 12 is preferably configured to include a current source operating in the subthreshold region, as is known in the art (and as will be described hereinbelow), such that the steady-state current dissipated by reference circuit 12 is on the order of 40 nA.

Crystal oscillator 14 is a current-based oscillator of conventional construction, and includes a single gain stage with crystal and resistive feedback. Crystal resonator 15 is a conventional quartz crystal, and is connected off-chip to nodes XTAL1, XTAL2 in the conventional manner. Crystal oscillator 14 includes bias feedback resistor R connected across nodes XTAL1, XTAL2, and crystal frequency control capacitors $C_1$, $C_2$ connected between nodes XTAL1, XTAL2, respectively, and ground. The single gain stage in crystal oscillator 14 is provided in the conventional manner by a series of MOS transistors 11, 13, 19. P-channel transistor 11 has its source-drain path connected between $V_{cc}$ and node XTAL1, and has its gate biased by reference voltage $V_{pref}$. N-channel transistor 19 has its source connected to ground and its drain connected to the source of n-channel gain transistor 13; the gate of n-channel transistor 19 is biased by reference voltage $V_{nref}$. N-channel gain transistor 13 has its drain connected to node XTAL1 and its gate connected to node XTAL2.

According to this arrangement, transistor 11 operates as a current source load, biased by reference voltage $V_{pref}$. Transistor 13 operates as a current-starved inverter, as the current therethrough is limited by transistors 11, 19. As a result, gain transistor 13 is self-biased in the weak inversion regions via resistor R and the current source transistors 11, 19. This current-limited self-biased implementation allows crystal oscillator 14 to operate as a class A or class AB oscillator, preventing significant bias point shift between its DC and AC operating points. In addition, the small signal operation of crystal oscillator 14 ensures low signal and low loss operation of crystal resonator 15.

According to this conventional construction, the output of crystal oscillator 14 is applied to level shift circuit 16, under the same bias conditions, to amplify the small signal output of oscillator 14 prior to application of the signal to frequency divider 18. According to this conventional approach, level shift circuit 16 includes a series of MOS transistors 21, 22, 23 having their source-drain paths connected in series between $V_{cc}$ and ground. P-channel transistor 21 and n-channel transistor 23 have their gates biased by reference voltages $V_{pref}$, $V_{nref}$, respectively. N-channel gain transistor 22 has its source connected to the drain of transistor 23, its drain connected to the drain of transistor 21 at node OUT, and its gate connected to oscillator node XTAL2. The signal at node OUT will thus be an amplified version of the oscillator output, and at the same frequency.

Frequency divider 18, according to this conventional arrangement, divides down the amplified signal at node OUT to the desired frequency to produce a clock signal at node CLK for distribution elsewhere in the integrated circuit or the electronic system. Frequency divider 18 is conventionally implemented as a series of counter stages, as is well known in the art, with the appropriate feedback stages implemented as necessary to provide the proper output frequency at node CLK.

According to this conventional approach for generating clock signals, however, the first several counter stages of frequency divider 18 draws significant current, due to the necessity of applying full digital signals to conventional frequency divider counter stages, as produced by level shift circuit 16. The first counter stages of frequency divider 18 are thus switching over large signal swings at relatively high frequencies, causing the high level of significant power dissipation which is undesirable for battery-powered systems.

It is therefore an object of the present invention to provide a clock generator circuit that has reduced current drain and power dissipation relative to conventional clock generator circuits.

It is a further object of the present invention to provide such a circuit which utilizes clocked current sources to limit the overall current requirements of the circuit.

It is a further object of the present invention to provide such a clock generator circuit that is readily implementable in CMOS technology.

Other objects and advantages of the present invention will be apparent to those of ordinary skill in the art having reference to the following description in combination with its drawings.

SUMMARY OF THE INVENTION

The invention may be implemented by a clock generator circuit based upon a crystal oscillator and a subthreshold reference generator, where the periodic signal is divided down in frequency prior to amplification. A current switch receives the output of the crystal oscillator and, via current mirror output legs, produce current source control signals based upon the oscillator output. The current source control signals are applied to current sources in current source switched latches connected in counter fashion in a frequency divider. This construction of the latches limits significant current drain to the switching intervals only, thus reducing the overall current required over time. The output of the frequency divider is applied to a level shift circuit which amplifies the output clock signal to the desired voltage swing.

DETAILED DESCRIPTION OF THE PREFERRED EMBODIMENT

Figure 2:
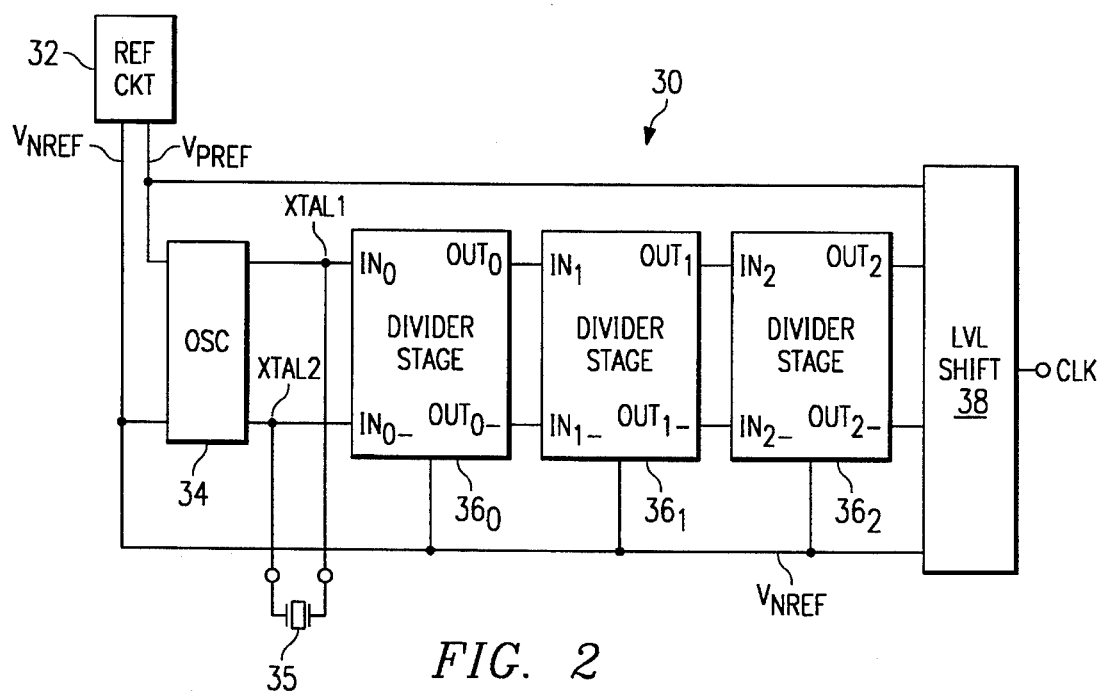
FIG. 2 is an electrical diagram, in block form, of a clock generator circuit according to the preferred embodiment of the invention.

Referring now to FIG. 2, clock generator circuit 30 according to the preferred embodiment of the invention will now be described in detail. In this example, clock generator circuit 30 produces an output clock signal, at terminal CLK, that is divided-down in frequency from a periodic signal produced by crystal oscillator circuit 34 using off-chip crystal resonator 35. While clock generator circuit 30 performs a by-eight frequency division, as will be described hereinbelow, it should be apparent to those of ordinary skill in the art clock generator circuit 30 may divide down the frequency to another subfrequency merely by selection of the number of stages in the forward or feedback loops, in the conventional manner. Selection of the proper frequency division factor will, of course, depend upon the particular clock frequency desired and the component selection for crystal oscillator 34, as is well known.

According to this embodiment of the invention, clock generator circuit 30 includes a low-current reference voltage circuit 32 for producing reference voltages $V_{pref}$, $V_{nref}$, which are applied to crystal oscillator 34. Crystal oscillator 34 is connected to crystal resonator 35 (which is preferably an external component, as is conventional in the art) at nodes XTAL1, XTAL2, and is configured in the conventional manner (such as that described hereinbelow) to produce a periodic signal at nodes XTAL1, XTAL2. Nodes XTAL1, XTAL2 are received at inputs $IN_0$, $IN_{0\_}$ of a first divider stage $36_0$. The outputs $OUT_0$, $OUT_{0\_}$ of divider stage $36_0$ are connected to inputs $IN_1$, $IN_{1\_}$ of the next divider stage $36_1$, which in turn has its outputs $OUT_1$, $OUT_{1\_}$ connected to inputs $IN_2$, $IN_{2\_}$ of the third divider stage $36_2$. As will be described hereinbelow, each divider stage 36 includes a pair of latches biased by current sources that are switched in complementary fashion, such that each divider stage 36 produces a periodic signal at its outputs OUT, OUT_ at half the frequency of the signal at its inputs IN, IN_. Outputs $OUT_2$, $OUT_{2\_}$ of the final divider stage $36_2$ are received by level shift circuit 38 to produce the desired voltage swing at terminal CLK.

Figure 1:
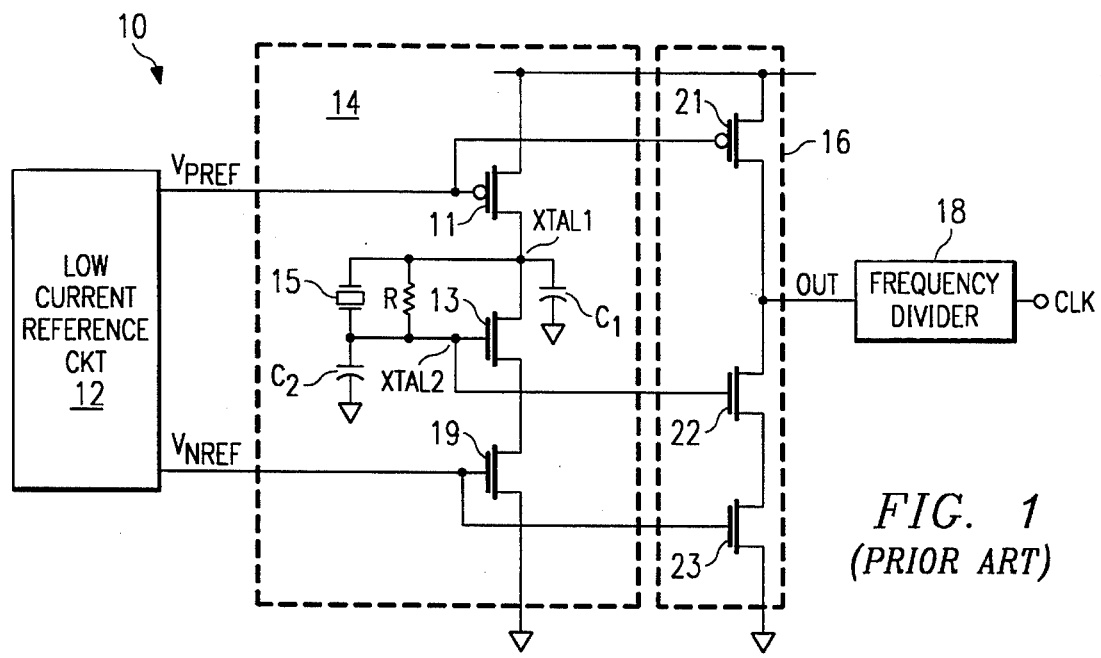
FIG. 1 is an electrical diagram, in block and schematic form, of a clock generator circuit according to the prior art.

Similarly as described above relative to clock generator circuit 10 of FIG. 1, the voltage swing of the periodic clock signal at nodes XTAL1, XTAL2 of clock generator circuit 30 according to the present invention is relatively small, so that crystal oscillator 34 can operate in a low loss, low power, condition. According to this embodiment of the invention, this small voltage swing periodic signal (e.g., on the order of 200 mV) can be applied directly to frequency divider stages 36, prior to amplification by level shift circuit 38. This operation reduces the current drain and power dissipation of clock generator circuit 30 according to the present invention relative to that of conventional clock generator circuits, such as clock generator circuit 10 of FIG. 1. Clock generator circuit 30 according to the present invention is especially advantageous when implemented into power sensitive applications, such as portable computers and other portable systems that operate from batter power either as the primary power source or as a backup in a loss of power event.

Figure 3:
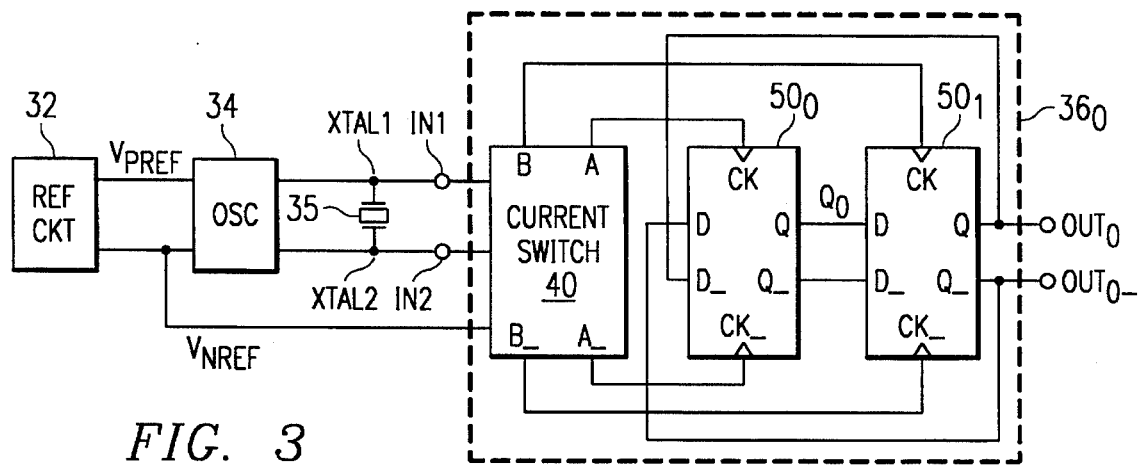
FIG. 3 is an electrical diagram, in block form, of a first stage of the clock generator circuit of FIG. 2.

Referring now to FIG. 3, the construction of first divider stage $36_0$ will now be described in detail. Second and third divider stages $36_1$, $36_2$ of clock generator circuit 30 are similarly constructed as divider stage $36_0$; it is therefore contemplated that the description of the construction and operation of first divider stage $36_0$ will be adequate to describe each of divider stages 36 according to this preferred embodiment of the invention. First divider stage $36_0$ includes current switch 40, having inputs $IN_0$, $IN_{0\_}$ connected to nodes XTAL1, XTAL2 of crystal oscillator 34. Current switch 40 provides current source control signals A, A_ to complementary clock inputs CK, CK_ of D-type latch $50_0$, and current source control signals B, B_ to complementary clock inputs CK, CK_ of D-type latch $50_1$. Latches 50, as will be described hereinbelow, are of the current source switched type, in which the complementary clock inputs CK, CK_ control pull-up and pull-down current sources therein.

Outputs Q, Q_ of latch $50_0$ are connected to inputs D, D_, respectively, of latch $50_1$. Outputs Q, Q_ of latch $50_1$ are cross-connected to inputs D_, D, respectively, of first latch $50_0$. As is known in the art, and as apparent from this description and FIG. 3, the connection of inputs D, D_ of latch $50_0$ to the complementary outputs (Q_, Q) of latch $50_1$ implements latches $50_0$, $50_1$ as a divide-by-two frequency divider.

Figure 4A:
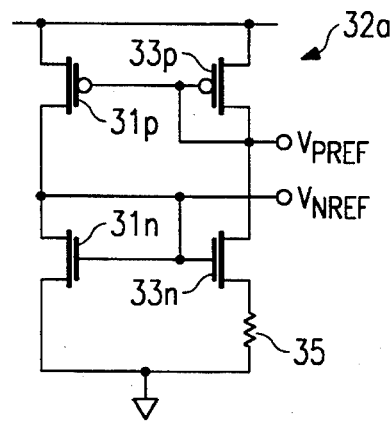
FIGS. 4a through 4c are electrical diagrams, in schematic form, of various embodiments of a voltage reference circuit as used in the preferred embodiment of the invention.
Figure 4B:
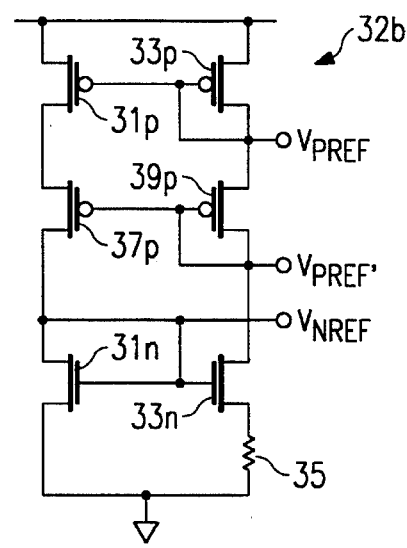
Figure 4C:
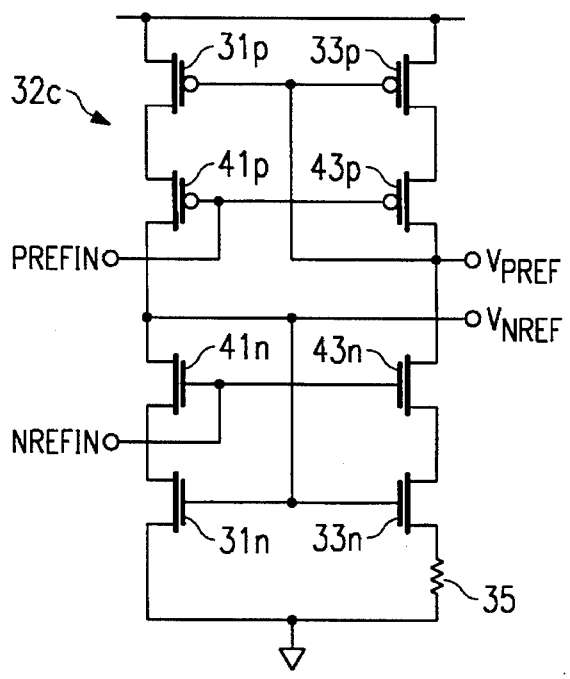

As noted above, it is preferable for purposes of minimizing power dissipation that crystal oscillator 34 operate at small voltage swings, which requires proper biasing by reference voltage circuit 32. Referring now to FIGS. 4a through 4c, alternative conventional examples of reference voltage circuit 32 will now be described in detail, to describe the best mode of the present invention.

FIG. 4a illustrates reference circuit 32a, which produces reference voltages $V_{pref}$, $V_{nref}$. Reference circuit 32a has a first complementary leg of p-channel transistor 31p with its source biased to $V_{cc}$, and n-channel transistor 31n with its source biased to ground; the drains of transistors 31p, 31n are connected together at node $V_{nref}$. The second leg of reference circuit 32a has p-channel transistor 33p with its source biased to $V_{cc}$ and n-channel transistor 33n with its source biased to ground through resistor 35; the drains of transistors 33p, 33n are connected together at node $V_{pref}$. The gates of transistors 31p, 33p are connected together at node $V_{pref}$, and the gates of transistors 31n, 33n are connected together at node $V_{nref}$. In this second leg, however, transistor 33n has a channel width to channel length ratio (W/L) that is a multiple of (i.e., larger than) that of the other transistors 31p, 31n, 33p. For example, the W/L of n-channel transistor 33n may be ten times the W/L of transistors 31p, 31n, 33p (which have equal W/Ls relative to one another).

In reference circuit 32a, each of transistors 31p, 31n, 33p, 33n is biased into the sub-threshold region. As reference circuit 32a operates as a current mirror, the drain current through transistors 31p, 31n is equal to that through transistors 33p, 33n and resistor 35; for conventional construction, this drain current will be on the order of 20 nA for each leg. Alternatively, the construction of reference circuit 32a may be altered so that the leg currents are ratioed, if desired. Because of the subthreshold bias condition, the equal drain currents, and the presence of resistor 35, the gate-to-source voltage across larger transistor 33n will be less than that for smaller transistor 31n by an amount determined by the transistor size ratio and the subthreshold current slope. This difference in gate-to-source voltage produces the voltage across resistor 35. The value of resistor 35 and the gate-to-source voltage difference determines the current level in the bias circuit.

Reference circuit 32b shown in FIG. 4b is configured similarly as reference circuit 32a, but includes additional transistors 37p, 39p to produce an additional reference voltage $V_{pref}'$. P-channel transistor 37p has its source connected to the drain of p-channel transistor 31p and has its drain connected to the drain of n-channel transistor 31n at node $V_{nref}$. P-channel transistor 39p has its source connected to the drain of p-channel transistor 33p at node $V_{pref}$ and has its drain connected to the drain of n-channel transistor 33n. The gates of p-channel transistors 37p, 39p are connected together, and to the drains of p-channel transistor 39p and n-channel transistor 33n at node $V_{pref}'$. In this example, p-channel transistors 37p, 39p also have a large W/L relative to that of transistors 31p, 33p, 31n, similarly as transistor 33n.

In operation, as in the case of reference circuit 32a, the drain current through transistors 31p, 37p, 31n will be equal to the drain current through transistors 33p, 39p, 33n, and resistor 35. The subthreshold bias of all transistors in reference circuit 32b, along with the differing W/L ratios, cause the voltage drops across the larger devices 37p, 39p, 33n to be lower than across the smaller transistors 31p, 33p, 31n, thus generating reference voltages $V_{pref}$, $V_{nref}$, $V_{pref}'$.

FIG. 4c illustrates reference circuit 32c, which produces reference voltages $V_{pref}$, $V_{nref}$ in a manner that is under the control of input reference voltages PREFIN, NREFIN. Input reference voltages PREFIN, NREFIN may be inputs to the integrated circuit, or alternatively may be reference voltages produced by another on-chip reference voltage generator circuit. Reference circuit 32c includes transistors 31p, 31n, 33p, 33n, and resistor 35 implemented into two legs, as before, with transistor 33n having a substantially larger W/L ratio than transistors 31p, 31n, 33p.

In addition, however, the first leg of reference circuit 32c includes p-channel transistor 41p and n-channel transistor 41n with their source-drain paths connected in series between the drain of transistor 31p and the drain of transistor 31n. Similarly, the second leg of reference circuit 32c includes p-channel transistor 43p and n-channel transistor 43n with their source-drain paths connected in series between the drain of transistor 33p and the drain of transistor 33n. Transistors 41p, 41n, 43p, 43n preferably have a large W/L ratio, similar to that of transistor 33n. The gates of transistors 41p, 43p are connected together and receive input reference voltage PREFIN, while the gates of transistors 41n, 43n are connected together and receive input reference voltage NREFIN. The gates of p-channel transistors 31p, 33p are connected together and to output node $V_{pref}$ at the drains of transistors 43p, 43n; similarly, the gates of n-channel transistors 31n, 33n are connected together and to output node $V_{nref}$ at the drains of transistors 41p, 41n.

Reference circuit 32c operates in the subthreshold mode, so long as input reference voltages PREFIN, NREFIN are approximately one p-channel threshold voltage below $V_{cc}$ and approximately one n-channel threshold voltage above ground, respectively.

Figure 5A:
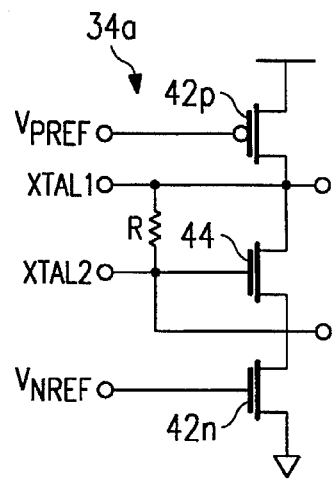
FIGS. 5a and 5b are electrical diagrams, in schematic form, of alternative embodiments of a crystal oscillator circuit as used in the preferred embodiment of the invention.

Referring back to FIGS. 2 and 3, clock generator circuit 30 includes crystal oscillator 34 which receives one or more of the reference voltages $V_{pref}$, $V_{nref}$, $V_{pref}'$ produced by the appropriate reference circuit 32. FIG. 5a illustrates crystal oscillator 34a according to first implementation useful in clock generator circuit 30 of the present invention.

Crystal oscillator 34a is similar to crystal oscillator 14 of FIG. 1, and as such receives reference voltages $V_{pref}$, $V_{nref}$ from reference circuit 32. Oscillator 34a includes p-channel bias transistor 42p with its source biased to $V_{cc}$ and its gate receiving reference voltage $V_{pref}$, and n-channel bias transistor 42n with its source biased to ground and its gate receiving reference voltage $V_{nref}$. Active n-channel transistor 44 has its drain connected to the drain of transistor 42p at node XTAL1, its source connected to the drain of transistor 42n, and its gate connected to node XTAL2. Feedback resistor R and external crystal resonator 35 (see FIGS. 2 and 3) are connected in parallel between nodes XTAL1, XTAL2; nodes XTAL1, XTAL2 are forwarded to divider stage $36_0$ of FIG. 2.

In operation, as is conventional in the art, crystal resonator 35 serves as a feedback LRC resonant circuit between nodes XTAL1, XTAL2 in crystal oscillator 34a, in parallel with feedback resistor R. Nodes XTAL1, XTAL2 will therefore oscillate periodically over a relatively small voltage swing (e.g., a range of 200 mV) defined by reference voltages $V_{pref}$, $V_{nref}$. This small-signal operation maintains crystal resonator 35 in the preferred low loss condition.

Figure 5B:
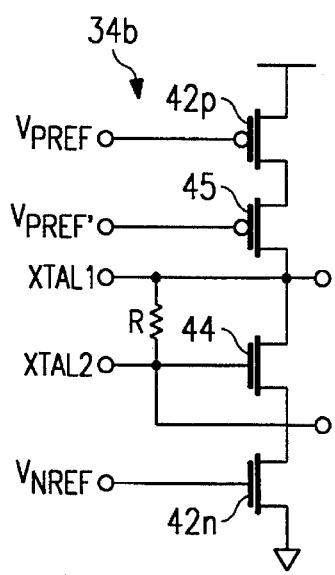

FIG. 5b illustrates crystal oscillator 34b according to an alternative implementation which utilizes the three reference voltages $V_{pref}$, $V_{nref}$, $V_{pref}'$ produced by reference circuit 32b of FIG. 4b. Crystal oscillator 34b is constructed similarly as crystal oscillator 34a, with the addition of p-channel transistor 45 having its source-drain path connected between the drain of transistor 42p and node XTAL1 at the drain of transistor 44, and having its gate receiving reference voltage $V_{pref}'$. As a result, p-channel transistor 45 is connected in a cascode configuration to current source load transistor 42p, increasing the output resistance of the current source at node XTAL1 in the conventional manner for cascode circuits. Crystal oscillator 34b thus allows reference voltage $V_{pref}'$ to more finely control the voltage swing at nodes XTAL1, XTAL2, as well as the drain current through transistors 42p, 45, 44, 42n.

According to the preferred embodiment of the invention, the small voltage swing periodic signal produced by crystal oscillator 34 is divided down in frequency prior to its amplification to a large voltage swing signal, so that the current consumed by clock generator circuit 30 is minimized. As such, referring to FIG. 3, the periodic signal at nodes XTAL1, XTAL2 is applied to current switch 40 in first divider stage $36_0$, for the first frequency division in clock circuit 30.

Figure 6A:
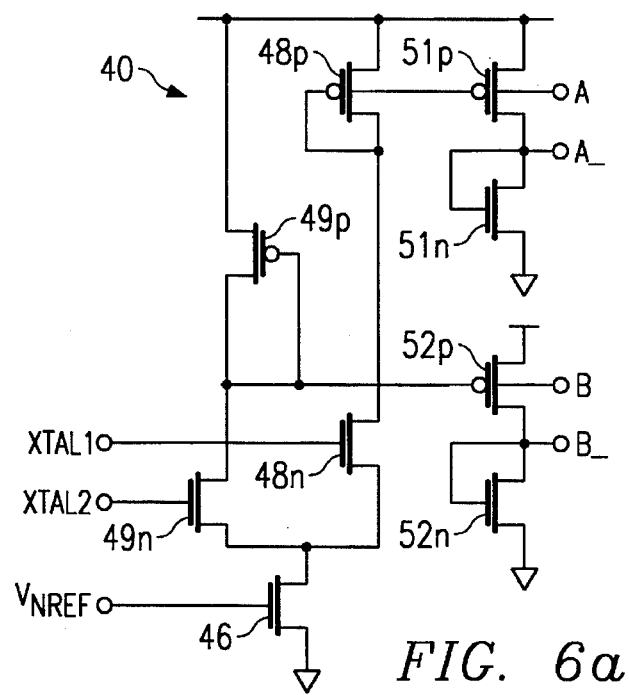
FIGS. 6a and 6b are electrical diagrams, in schematic form, of alternative implementations of a current switch as used in the preferred embodiment of the invention.

Referring now to FIG. 6a, the construction and operation of a first embodiment of current switch 40 will now be described in detail. Current switch 40 is primarily constructed as a current divider with two output current mirror legs. In this example, n-channel transistor 46 with its source connected to ground has its gate biased by reference voltage $V_{nref}$, and serves as a current source. A first divider leg of current switch 40 has p-channel load transistor 48p with its source biased to $V_{cc}$ and its gate tied to its drain. The gate-drain node of transistor 48p is connected to the drain of n-channel transistor 48n, which has its source connected to the drain of current source transistor 46 and its gate connected to node XTAL1 of oscillator 34. The second divider leg similarly has an n-channel transistor 49n with its source connected to the drain of current source transistor 46 and its gate connected to node XTAL2 of oscillator 34. In this second divider leg, p-channel load transistor 49p has its source biased to $V_{cc}$ and its gate connected to its drain, and to the drain of n-channel transistor 49n.

Referring to FIG. 2, inputs $IN_0$, $IN_0$_ of first divider stage $36_0$ thus correspond to the gates of transistors 48n, 49n, respectively, in current switch 40, which receive nodes XTAL1, XTAL2 of crystal oscillator 34 thereat.

As shown in FIG. 6a, a first current mirror output leg is formed by p-channel transistor 51p and n-channel transistor 51n which have their drains connected together and their sources biased to $V_{cc}$ and ground, respectively. The gate of transistor 51p is connected to the gate of transistor 48p, and thus to common drain node A of transistors 48p, 48n to produce a current source control signal. The gate of transistor 51n is connected to the common drain node A_ of transistors 51p, 51n, at which a complementary current source control signal is produced. Similarly, the second current mirror output leg is formed by p-channel transistor 52p and n-channel transistor 52n with their drains connected together at node B_ and their sources biased to $V_{cc}$ and ground, respectively; the gate of transistor 52n is connected to the common drain node at node B_. The gate of transistor 52p is connected to the gate of transistor 49p and to the common drain node B of transistors 49p, 49n, producing a current source control signal thereat which is complementary to that produced at node B_.

In operation, the periodic oscillating signal at nodes XTAL1, XTAL2 controls transistors 48n, 49n to conduct in a complementary fashion relative to one another, such that the bulk of the current of current source 46 alternates between the divider leg of transistors 48p, 48n on one hand, and the divider leg of transistors 49p, 49n, on the other. The current conducted through each divider leg is mirrored in its current mirror output leg. Specifically, the current conducted through transistor 48p (under the control of transistor 48n) is mirrored through transistors 51p, 51n; conversely, the current through transistor 49p is mirrored through transistors 52p, 52n. In this configuration, when the bulk of the current in the current divider is conducted by transistors 48p, 48n, node A at the drain of transistor 48p will be at a relatively small offset below $V_{cc}$, causing transistors 51p, 51n to conduct an amount of current ratioed by the relative size of transistor 51p to that of transistor 48p, as is conventional in current mirrors. Node A_ is pulled to a small offset above $V_{ss}$ during this time. The low current through transistors 49p, 49n (relative to that through transistors 48p, 48n) will be mirrored through transistors 52p, 52n, placing node B substantially at $V_{cc}$ and node B_ substantially at $V_{ss}$. Switching of the signal at nodes XTAL1, XTAL2 from oscillator 34 will cause the opposite divider leg (transistors 49p, 49n) to conduct the bulk of the current, resulting in complementary states at nodes A, A_, B, B_ from that described above. Accordingly, the signal at node B is complementary to the signal at node A, with the complementary nodes A_, B_ also being complementary to one another (as well as to nodes A, B, respectively). The signal swing of these complementary signals is relatively low, however, for example on the order of 200 mV.

Figure 6B:
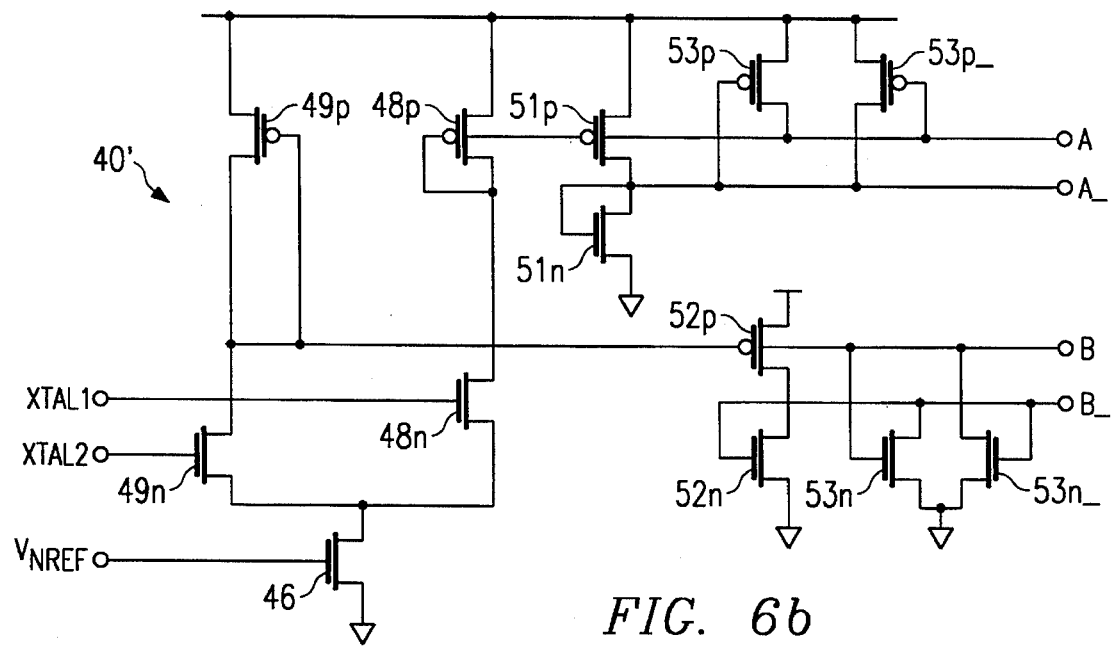

Referring to FIG. 6b, current switch 40' according to an alternative implementation is shown. Current switch 40' is substantially identical to current switch 40 of FIG. 6a, except that it further includes small keeper transistors 53p, 53p_, 53n, 53n_. P-channel keeper transistor 53p has its source biased to $V_{cc}$, its drain connected to node A and its gate connected to node A_, while p-channel keeper transistor 53p_ has its source also biased to $V_{cc}$, its drain connected to node A_ and its gate connected to node A. Similarly, n-channel keeper transistors 53n, 53n_ each have their sources biased to ground; transistor 53n has its drain connected to node B and its gate connected to node B_, while transistor 53n_ has its drain connected to node B_ and its gate connected to node B. In operation, keeper transistors 53p, 53p_, 53n, 53n_ serve to maintain the state of nodes A, A_, B, B_ during transitions of current switch 40'. The operation of current switch 40' is thus cleaner than that of current switch 40, particularly at higher frequencies.

Figure 7A:
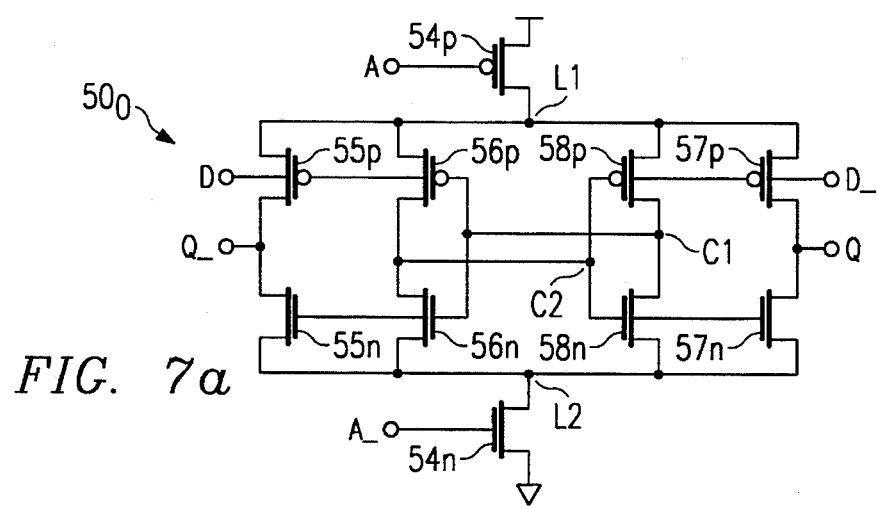
FIGS. 7a and 7b are electrical diagrams, in schematic form, of alternative implementations of a current-clocked latch as used in the preferred embodiment of the invention.

Referring back to FIG. 3, nodes A, A_ are connected to the complementary clock inputs of first latch $50_0$ in first divider stage $36_0$, and nodes B, B_ are connected to the complementary clock inputs of second latch $50_1$ of first divider stage $36_0$. As noted above, latches 50 are of the current source switched type, including cross-coupled CMOS inverters. FIG. 7a schematically illustrates latch $50_0$ which receives data inputs D, D_ and nodes A, A_ from current switch 40 as clock inputs, specifically clock inputs in the form of current source control signals. Latch $50_1$ will, of course, be similarly constructed as latch $50_0$.

Latch $50_0$ includes p-channel pull-up current source transistor 54p with its source biased to $V_{cc}$, its drain at node L1, and its gate controlled by the current source control signal at node A of current switch 40. Similarly, n-channel pull-down current source transistor 54n has its source biased to ground, its drain at node L2, and its gate controlled by complementary current source control signal at node A_ of current switch 40. The latching mechanism of latch $50_0$ is implemented in the conventional manner by CMOS inverters, cross-coupled at nodes C1, C2. A first CMOS inverter is formed by p-channel transistor 56p with its source connected to node L1 and its drain connected to the drain of n-channel transistor 56n at node C2, and by n-channel transistor 56n with its source connected to node L2, and its gate connected to the gate of p-channel transistor 56p at node C1. P-channel transistor 58p and n-channel 58n form the opposing CMOS inverter, with their drains connected together at node C1, their gates connected together at node C2, and their sources at nodes L1, L2, respectively. Latch 500 also has complementary output stages, one formed by p-channel transistor 55p and n-channel transistor 55n with their drains connected together to drive output Q_, their gates connected together at node C1, and their sources at nodes L1, L2, respectively; the other output stage is formed by p-channel transistor 57p and n-channel transistor 57n having their drains connected together to drive output Q, their gates connected together to node C2, and their sources at nodes L1, L2, respectively. Latch $50_0$ receives input D at node C1 and input D_ at node C2.

In operation, the state of outputs Q, Q_ of latch $50_0$ depend upon the states of inputs D, D_, as clocked by current source transistors 54p, 54n. In this example, both of complementary current source transistors 54p, 54n will be more conductive when node A is at a low level (and node A_high), and less conductive when node A is high (and node A_ low). It is contemplated that transistors 54p, 54n are sized to conduct on the order of 30 nA in their more conductive condition and conduct on the order of picoamperes in their less conductive state. These currents are selected so that latch $50_0$ will latch in the data state at its D, D_ inputs when transistors 54p, 54n are made more conductive. When transistors 54p, 54n are less conductive (i.e., nodes A, A_ are in their relatively high and low states, respectively), the small current sourced therethrough may be sufficient to maintain the stored state of latch $50_0'$ for a short time, but is inadequate to drive the outputs Q, Q' regardless of the logic levels at the D, D_ inputs. In the limit of the less conductive condition, transistors 54p, 54n are effectively off, and the states of nodes C1, C2 are temporarily held by the capacitance on the respective nodes.

Figure 7B:
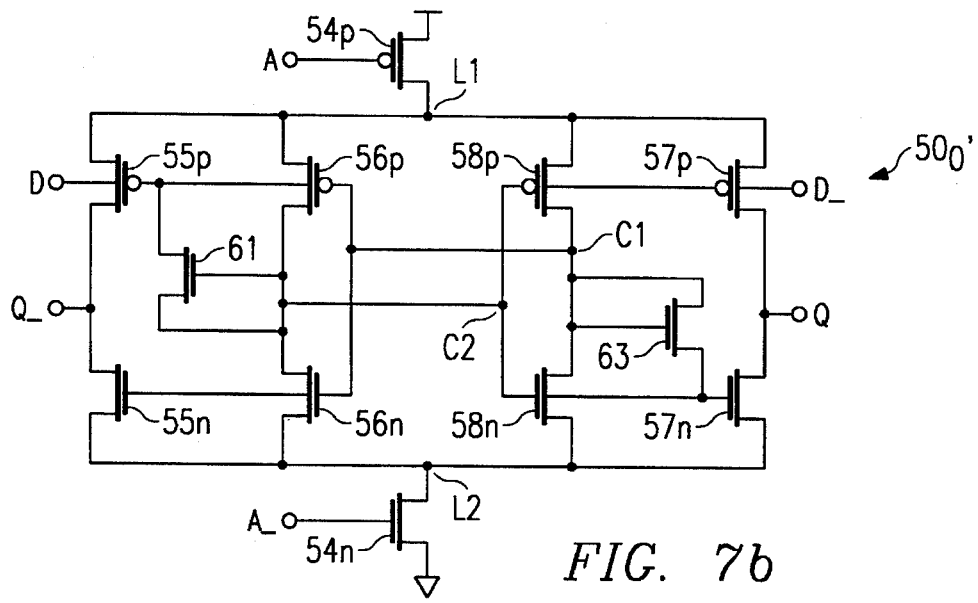

Referring now to FIG. 7b, the construction of latch $50_0'$ according to an alternative implementation will now be described. The construction of latch $50_0'$ is substantially identical to that of latch $50_0$ described hereinabove, except that latch $50_0'$ also includes clamping transistors 61, 63. N-channel latching transistor 61 has its drain and gate connected to node C2, and its source connected to node C1; conversely, n-channel latching transistor 63 has its drain and gate connected to node C1 and its source connected to node C2. Transistors 61, 63 thus limit the voltage swing of cross-coupled nodes C1, C2 to a voltage approximately on the order of an n-channel threshold voltage, ensuring small signal operation of latch $50_0'$.

Latches 50 are thus constructed to operate as D-type latches, where the clocking action is based upon the switching of current source transistors 54p, 54n connected between $V_{cc}$ and node L1, and between node L2 and ground, respectively. As a result, not only is the current drawn by latches 50 controlled to a certain level, but the time during which this current is drawn is reduced. Latches 50 can therefore operate with relatively small voltage swing signals at nodes A, A_, B, B_, and at inputs D, D_, such as on the order of 200 mV. The voltage swings at outputs Q, Q_ also are relatively small, such as on the order of 200 mV, allowing succeeding latch stages to similarly operate responsive to small signal swing.

Referring back to FIG. 3, first divider stage $36_0$ includes two latches $50_0$, $50_1$ which are connected to one another in such a manner as to form a two-stage counter, and thus a divide-by-two frequency divider. In this example, outputs Q, Q_ of latch $50_0$ are connected to inputs D, D_, respectively, of latch $50_1$. Outputs Q, Q_ of latch $50_1$ are connected to inputs D_, D, respectively, of latch $50_0$, to provide the negative feedback necessary to operate as a clocked counter. The sequential operation of first stage divider $36_0$ is shown in the following table, with the "phase" column indicating the current source control signal A or B that is active in each cycle, and with the results of the latch shown at the end of the stated phase:

| Phase | Latch $50_0$ | | Latch $50_1$ | | |
|---|---|---|---|---|---|
| | D | Q | D | Q | Q_ |
| $A_n$ | 0 | 0 | 0 | 1 | 0 |
| $B_n$ | 1 | 0 | 0 | 0 | 1 |
| $A_{n+1}$ | 1 | 1 | 1 | 0 | 1 |
| $B_{n+1}$ | 0 | 1 | 1 | 1 | 0 |
| $A_{n+2}$ | 0 | 0 | 0 | 1 | 0 |

This operational sequence thus repeats itself every two cycles of the current source control signals at nodes A, B.

Figure 8:
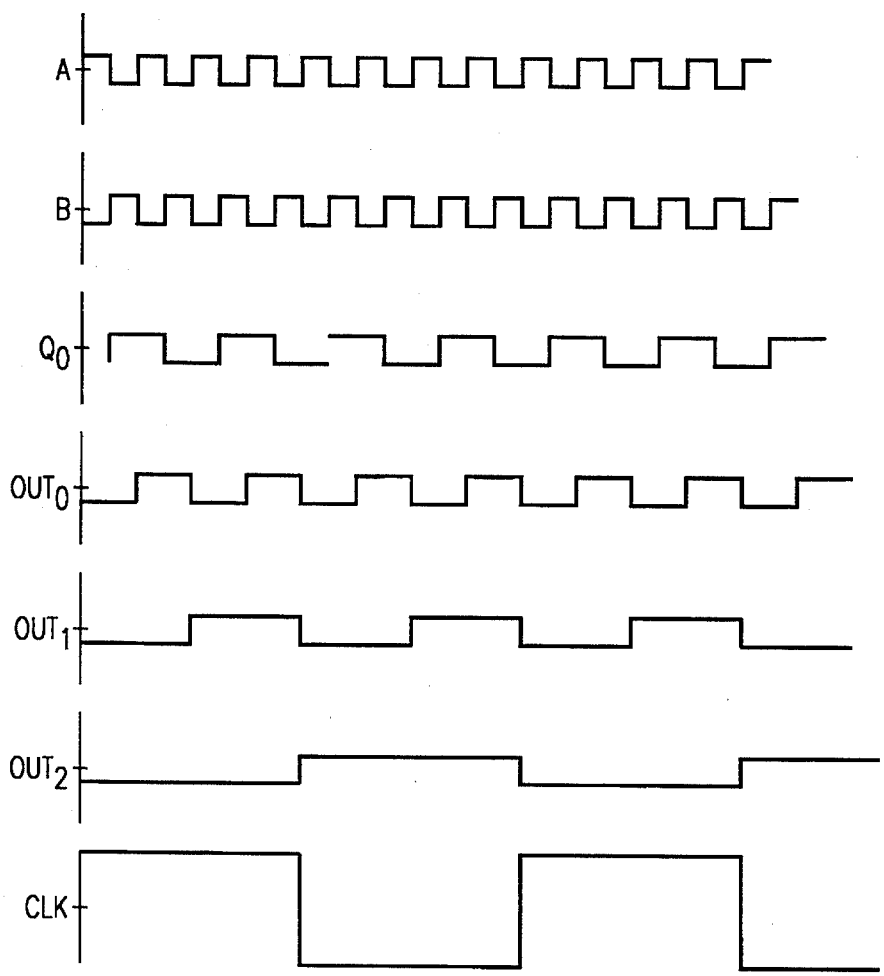
FIG. 8 is a timing diagram illustrating the operation of the clock generator circuit of FIG. 2.

Referring to FIG. 8, which illustrates the operation of clock generator circuit 30 of FIG. 2, attention is directed to the first three lines which illustrate the operation of first divider stage $36_0$. Lines A, B illustrate the periodic signals at nodes A, B of current switch 40; as is evident from the description hereinabove, the states at nodes A, B are complementary to the states at terminals XTAL1, XTAL2, respectively, of crystal oscillator 34. Line $Q_0$ illustrates the signal at output Q of latch $50_0$, and line $OUT_0$ illustrates the signal at output Q of latch $50_1$, which serves as output $OUT_0$ of first divider stage $36_0$ of FIG. 2. As is evident from the foregoing table and as illustrated in FIG. 8, the frequency of the signal at output Q of latch $50_1$, and thus at outputs $OUT_0$, $OUT_{0\_}$ of first divider stage $36_0$, is one-half that of the signal at outputs A, B of current switch 40.

Referring back to FIG. 2, outputs $OUT_0$, $OUT_{0\_}$ of first divider stage $36_0$ are connected to inputs $IN_1$, $IN_{1\_}$, respectively of second divider stage $36_1$. According to this embodiment of the invention, second divider stage $36_1$ is similarly constructed as first divider stage $36_0$ described hereinabove, and thus contains a current switch 40 followed by two D-type latches 50, with current switch 40 in second divider stage $36_4$ also receiving reference voltage $V_{nref}$ in the manner shown in FIG. 6a. As in the case of first divider stage $36_0$, inputs $IN_1$, $IN_{1\_}$ of second divider stage $36_1$ correspond to the gates of transistors 48n, 49n in its current switch 40. Second divider stage $36_1$ thus operates in the same manner as first divider stage $36_0$, such that the periodic signal appearing at its outputs $OUT_1$, $OUT_{1\_}$ is at one-half the frequency of the periodic signal applied to its inputs $IN_1$, $IN_{1\_}$, and thus at one-fourth the frequency of the oscillator frequency at terminals XTAL1, XTAL2 (i.e., at nodes A, B of current switch 40 in first divider stage $36_0$), as illustrated by line $OUT_1$ in FIG. 8. Since second divider stage $36_1$ is constructed similarly as first divider stage $36_0$, the signals at outputs $OUT_1$, $OUT_{1\_}$ of second divider stage $36_1$ also have a small voltage swing, also on the order of 400 mV.

As noted above, current switch 40 of second divider stage $36_1$ receives reference voltage $V_{nref}$ at its current source transistor (corresponding to transistor 46 of FIG. 6a). Alternatively, the current source in current switch 40 of second divider stage $36_1$ could be controlled by one of the nodes A, A_, B, B_ from the current switch 40 of the prior divider stage $36_0$, so as to also operate in a switched manner, further reducing the current drawn by clock generator circuit 30.

In similar fashion, inputs $IN_2$, $IN_{2\_}$ of third divider stage $36_2$, similarly constructed as first and second divider stages $36_0$, $36_1$, receives the signals generated at outputs $OUT_1$, $OUT_{1\_}$ of second divider stage $36_1$. Reference voltage $V_{nref}$ is also provided to third divider stage $36_2$, specifically to the current source in current switch 40 therein; alternatively, as noted above, the current source may be controlled by the output of current switch 40 in a prior divider stage $36_0$, or $36_1$. Third divider stage $36_2$ produces a periodic signal at its outputs $OUT_2$, $OUT_{2\_}$ that is at half the frequency of that at outputs $OUT_1$, $OUT_{1-}$, as shown in FIG. 8 relative to line $OUT_2$. Accordingly, the frequency of the signal at outputs $OUT_2$, $OUT_{2\_}$ is at one-eighth the frequency of that produced by crystal oscillator 34 at nodes XTAL1, XTAL2 (as evident in FIG. 8 from lines A, B), yet is a small voltage swing signal as before.

Outputs $OUT_2$, $OUT_{2\_}$ are presented to level shift circuit 38 shown in FIG. 2 for amplification into the desired voltage swing for clock signal CLK. Level shift circuit 38 is similarly constructed as level shift circuit 16 of FIG. 1, utilizing reference voltages $V_{pref}$, $V_{nref}$ and including a single gain stage. As a result, the output voltage swing of clock signal CLK is rail-to-rail, from $V_{cc}$ to ground. Of course, alternative conventional amplifier or level shift circuitry may be used to amplify the differential signal to the voltage swing desired at terminal CLK. Line CLK of FIG. 8 illustrates the amplified signal, which is at one-eighth the frequency of that of oscillator 34.

Clock generator circuit 30 according to the preferred embodiment of the invention thus draws significantly less current, and thus dissipates significantly less power, than prior clock generator circuits, as it is able to operate without requiring the amplification of high-frequency signals such as at the output of the crystal oscillator. This reduced power dissipation is provided by latches in the frequency divider that are of the current source switched type, where the oscillator output controls the clocking of current sources therein. As such, limited current is drawn by the latches only during short durations (i.e., during switching periods). Further, this clocked latch operation allows the input and output signals to be of small voltage swings, further reducing the power dissipation of the clock generator circuit. The clock generator circuit of the present invention thus requires significantly less current than that drawn according to prior techniques, such as shown in FIG. 1, which require level shifting of the oscillator output prior to frequency division, which results in signals of large voltage swing that switch at high frequencies. The present invention is therefore advantageous for use in low-power applications such as portable digital systems and computers.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A clock generator circuit in an integrated circuit, comprising:

a reference circuit for producing a reference voltage;

an oscillator circuit, coupled to said reference circuit, for producing an input periodic signal having a voltage range defined by said reference voltage;

a frequency divider, connected to said oscillator circuit to receive the input periodic signal, for producing an output periodic signal at a frequency other than that of the input periodic signal, comprising:

a first divider stage, comprising:

a first current switch, having inputs for receiving the input periodic signal from said oscillator circuit, for producing current source control signals responsive to the input periodic signal, said input periodic signal having a frequency; and a first plurality of latches, each of said first plurality of latches having a data input and a data output, and each including a first current source controlled by one of the current source control signals from said first current switch responsive to which it stores a data state corresponding to a voltage level received at its data input, wherein said first plurality of latches are interconnected in a sequence between the data input and data output, to form a counter so that the signal at the data output of the last of said first plurality of latches in the sequence has a frequency that is divided down from the frequency of the input periodic signal; and a level shift circuit, connected to said frequency divider to receive the output periodic signal, for amplifying the output periodic signal.

2. The circuit of claim 1, wherein said frequency divider further comprises a second divider stage, comprising:

a second current switch, having inputs for receiving the periodic signal at the data output of the last of the plurality of latches in the sequence of the first plurality of latches, for producing current source control signals responsive thereto; and a second plurality of latches, each of said second plurality of latches having a data input and a data output, and each including a current source controlled by one of the current source control signals from said second current switch responsive to which it stores a data state corresponding to a voltage level received at its data input, wherein the data input and data output of said second plurality of latches are interconnected to form a counter so that the signal at the data output of the last of said second plurality of latches in the sequence has a frequency that is divided down from the frequency of the data output of the last of the plurality of latches in the sequence of the first divider stage.

3. The circuit of claim 1, wherein each of said first plurality of latches comprises:

first and second inverters, each having an input and an output cross-connected so that the input of the first inverter is connected to the output of the second inverter and so that the input of the second inverter is connected to the output of the first inverter;

wherein each of said first and second inverters is biased at a first bias node;

and wherein said first current source is connected between a first bias voltage and said first bias node.

4. The circuit of claim 3, wherein each of said first and second inverters is also biased at a second bias node;

and wherein each of said plurality of latches further comprises a second current source, said second current source connected between a second bias voltage and said second bias node.

5. The circuit of claim 1, wherein said first current switch produces first and second current source control signals of different phase relative to one another responsive to the input periodic signal;

wherein the first current source in a first one of said first plurality of latches is controlled by said first current source control signal;

and wherein the first current source in a second one of said first plurality of latches is controlled by said second current source control signal.

6. The circuit of claim 1, wherein said oscillator circuit presents the input periodic signal as complementary signals at first and second oscillator outputs;

and wherein said first current switch comprises:

a current source connected between a first bias voltage and a bias node, and controlled by said reference voltage;

a first current divider leg, comprising a load and a first transistor connected in series between a second bias voltage and said bias node, said first transistor having a control terminal coupled to receive the first oscillator output;

a second current divider leg, comprising a load and a second transistor connected in series between a second bias voltage and said bias node, said second transistor having a control terminal coupled to receive the second oscillator output;

a first current mirror output leg, comprising a load and a first mirror transistor connected between said first and second bias voltages, said first mirror transistor having a control terminal coupled to said first divider leg so that said first current mirror output leg produces a signal corresponding to the current through said first divider leg; and a second current mirror output leg, comprising a load and a second mirror transistor connected between said first and second bias voltages, said second mirror transistor having a control terminal coupled to said second divider leg so that said first current mirror output leg produces a signal corresponding to the current through said first divider leg.

7. The circuit of claim 1, wherein said oscillator circuit comprises a crystal oscillator.

8. The circuit of claim 1, wherein said reference voltage circuit comprises a sub-threshold reference circuit.

9. A clock generator circuit, comprising:

a reference voltage circuit for producing a reference voltage;

a crystal oscillator, coupled to said reference voltage circuit, for producing a periodic signal at first and second oscillator terminals having a voltage swing controlled by said reference voltage;

a frequency divider, coupled to said first and second oscillator terminals, having a plurality of divider stages connected in sequence for producing a periodic signal having a frequency divided-down from that of the periodic signal at said first and second oscillator terminals, each of said divider stages comprising:

a current switch, having first and second input terminals, for producing first and second complementary output signals responsive to a periodic signal applied to said first and second input terminals; and first and second switched latches, each of said switched latches comprising cross-coupled inverters biased at a first bias node, and a first current source connected between a first bias voltage and the first bias node, said first and second switched latches connected in sequence so as to form a counter, said second switched latch presenting a complementary output;

wherein the first and second input terminals of said current switch in a first of said plurality of divider stages in the sequence are coupled to said first and second oscillator terminals;

wherein first and second input terminals of said current switches in divider stages in the sequence other than the first of said plurality of divider stages in the sequence are coupled to the complementary output of the second switched latch in a preceding divider stage; and a level shift circuit, for amplifying the complementary output of the second switched latch in the last of the plurality of divider stages in the sequence.

10. The circuit of claim 9, wherein the current switch in each of said plurality of divider stages each comprises:

a current source connected between a first bias voltage and a bias node, and having a control terminal;

first and second current divider legs connected between a second bias voltage, each of said first and second current divider legs comprising a load and a switching transistor, said switching transistor of said first current divider leg controlled by the first input terminal and said switching transistor of said second current divider leg controlled by the second input terminal;

a first current mirror output leg coupled to said first current divider leg, for producing said first complementary output signal responsive to the current through said first current divider leg; and a second current mirror output leg coupled to said second current divider leg, for producing said second complementary output signal responsive to the current through said second current divider leg.

11. The circuit of claim 10, wherein the control terminal of the current source in the current switch of the first of said plurality of divider stages in the sequence is coupled to said reference voltage.

12. The circuit of claim 11, wherein the control terminal of the current source in the current switch in each of the remainder of said plurality of divider stages in the sequence is coupled to said reference voltage.

13. The circuit of claim 11, wherein the control terminal of the current source in the current switch of the second of said plurality of divider stages in the sequence is coupled to one of the first and second complementary outputs of the current switch of the first of said plurality of divider stages in the sequence.

14. A method of generating a clock signal in an integrated circuit, comprising:

generating a reference voltage;

producing a periodic signal from a crystal oscillator, having a limited voltage swing defined by said reference voltage;

controlling current sources in counter latches of a frequency divider according to said periodic signal, to produce a periodic signal of divided-down frequency relative to said periodic signal by the steps of:

applying complementary signals based on said periodic signal to switching transistors in first and second legs of a current divider controlled by a current source, said first and second legs coupled to current mirror output legs to produce first and second control signals corresponding to the current in said first and second current divider legs, respectively;

applying said first control signal to a first counter current source in a first counter latch, said first counter latch having a data input and a data output and clocked by said first counter current source; and applying said second control signal to a second counter current source in a second counter latch, said second counter latch having a data input coupled to the data output of said first counter latch, having a data output coupled to the output of the counter at which the periodic signal of divided-down frequency is produced, and clocked by said second counter current source, the data output of the second counter latch being coupled to provide negative feedback to the data input of the first counter latch; and amplifying the voltage swing of said periodic signal of divided-down frequency to produce the clock signal.

15. The method of claim 14, further comprising:

applying said reference voltage to a current source in the current divider to control the current drawn through the current divider.

16. A method of generating a clock signal in an integrated circuit, comprising:

generating a reference voltage;

producing a periodic signal from a crystal oscillator, having a limited voltage swing defined by said reference voltage;

controlling current sources in counter latches of a frequency divider according to said periodic signal, to produce a periodic signal of divided-down frequency relative to said periodic signal, wherein said frequency divider uses a sequence of divider stages, each divider stage using a current switch and a plurality of counter latches; and amplifying the voltage swing of said periodic signal of divided-down frequency to produce the clock signal.

17. The method of claim 16, wherein said controlling step comprises:

applying complementary signals based on said periodic signal to switching transistors in first and second legs of a current divider controlled by a current source, said first and second legs coupled to current mirror output legs to produce first and second control signals corresponding to the current in said first and second current divider legs, respectively;

applying said first control signal to a first counter current source in a first counter latch, said first counter latch having a data input and a data output and clocked by said first counter current source; and applying said second control signal to a second counter current source in a second counter latch, said second counter latch having a data input coupled to the data output of said first counter latch, having a data output coupled to the output of the counter at which the periodic signal of divided-down frequency is produced, and clocked by said second counter current source, the data output of the second counter latch being coupled to provide negative feedback to the data input of the first counter latch;

and further comprising:

applying said reference voltage to the current source of a current divider of the first of said sequence of divider stages, to control the current drawn through the current divider.

\* \* \* \* \*